(12) United States Patent
Lee (10) Patent No.: US 6,781,535 B2
(45) Date of Patent: Aug. 24, 2004

(54) DECODER CAPABLE OF BEING EMPLOYED IN A RESISTANCE-ARRAY CONVERTING APPARATUS

(75) Inventor: Joon-Seok Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 110 days.

(21) Appl. No.: 10/137,245

(22) Filed: May 2, 2002

(65) Prior Publication Data

US 2002/0163324 A1 Nov. 7, 2002

(30) Foreign Application Priority Data

May 3, 2001 (KR) .......................................... 2001-24066

(51) Int. Cl.[7] ................................................ H03M 1/66
(52) U.S. Cl. ........................ 341/144; 345/92; 345/204
(58) Field of Search ................................ 341/144, 145, 341/136, 155, 126; 345/92, 87, 98, 104, 90, 100

(56) References Cited

U.S. PATENT DOCUMENTS

| | | | | |
|---|---|---|---|---|
| 5,701,095 | A | * 12/1997 | Ohsawa | ...................... 327/410 |
| 5,994,885 | A | 11/1999 | Wilcox et al. | ............... 323/285 |
| 6,313,819 | B1 | * 11/2001 | Maekawa et al. | ............. 345/92 |
| 6,483,494 | B1 | * 11/2002 | Liaw et al. | ..................... 345/92 |
| 6,559,824 | B1 | * 5/2003 | Kubota et al. | ............... 345/100 |
| 6,618,043 | B2 | * 9/2003 | Washio et al. | ............... 345/204 |
| 2002/0041267 | A1 | * 4/2002 | Jung | ........................... 345/92 |

FOREIGN PATENT DOCUMENTS

| | | | | |
|---|---|---|---|---|
| JP | 03-136527 | 6/1991 | ............ | H04B/7/26 |
| JP | 07-114432 | 5/1995 | | |
| JP | 08-330964 | 12/1996 | | |
| JP | 10-340067 | 12/1998 | ............ | G09G/3/36 |

OTHER PUBLICATIONS

*Notice of Preliminary Rejection* (with translation), corresponding to Korean Patent Applicaiton Serial No. 2001-24066, Korean Intellectual Property Office, dated May 26, 2003, 3 pages (including translation).

* cited by examiner

*Primary Examiner*—Brian Young
*Assistant Examiner*—John B Nguyen
(74) *Attorney, Agent, or Firm*—Marshall, Gerstein & Borun LLP (57) ABSTRACT

A decoding apparatus using a precharging scheme is provided, where the size of an IC is minimized. The decoding apparatus may be used in a resistance array digital/analog converting apparatus implemented in an IC for driving a TFT-LCD to minimize the size of the IC. The disclosed decoding apparatus includes an input device for inputting digital data signals, a precharge device for precharging a plurality of output nodes with a first logic value in response to a precharge signal before the plurality of output nodes are enabled by a digital data signal provided from the input device, and a switch device for providing a second logic value to an output node from among the plurality of output nodes.

22 Claims, 10 Drawing Sheets

DECODER CAPABLE OF BEING EMPLOYED IN A RESISTANCE-ARRAY CONVERTING APPARATUS

FIELD OF THE INVENTION

The present invention relates to a decoding apparatus and, more particularly, to a decoder capable of being employed in a Resistance-array Digital/Analog (RDA) converting apparatus in a Thin-Film Transistor Liquid Crystal Display (TFT-LCD) driver integrated circuit (IC).

DESCRIPTION OF THE PRIOR ART

Figure 1:
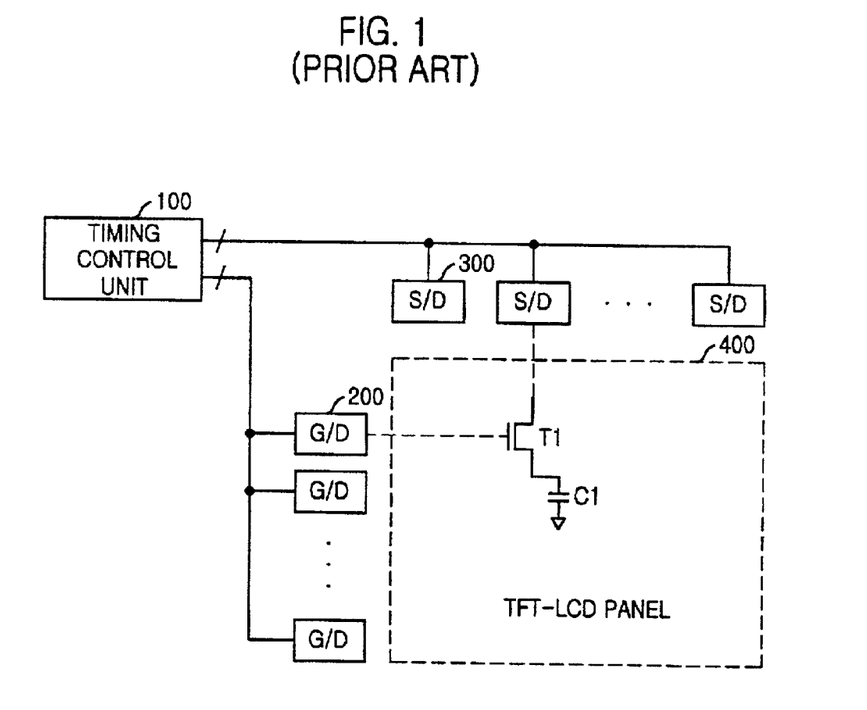
FIG. 1 is a diagram illustrating a conventional TFT-LCD.

FIG. 1 is a diagram illustrating a typical TFT-LCD. The TFT-LCD includes a timing control unit 100, an LCD panel 400, a plurality of gate drivers 200 and a plurality of source drivers.

The plurality of gate drivers 200 are driven by the timing control unit 100 and drive the gate lines of the LCD panel 400. The plurality of source drivers 300, also driven by the timing control unit 100, drive the source lines of the LCD panel 400 so that the LCD panel 400 displays data.

The LCD panel 400 comprises pixels arrayed in a matrix. Each pixel includes an LCD capacitor (C1) and a thin film transistor (T1). A source of the thin film transistor (T1) is connected to a source line driven by one of the source drivers 300 and a gate of the thin film transistor is connected to a gate line driven by one of the gate drivers 200.

The timing control unit 100 drives the gate lines assigned to the gate driver (200), sequentially one-by-one. The source driver 300 receives data from the timing control unit 100 and applies analog signals to the source lines so that the data is displayed on the TFT-LCD.

Figure 2:
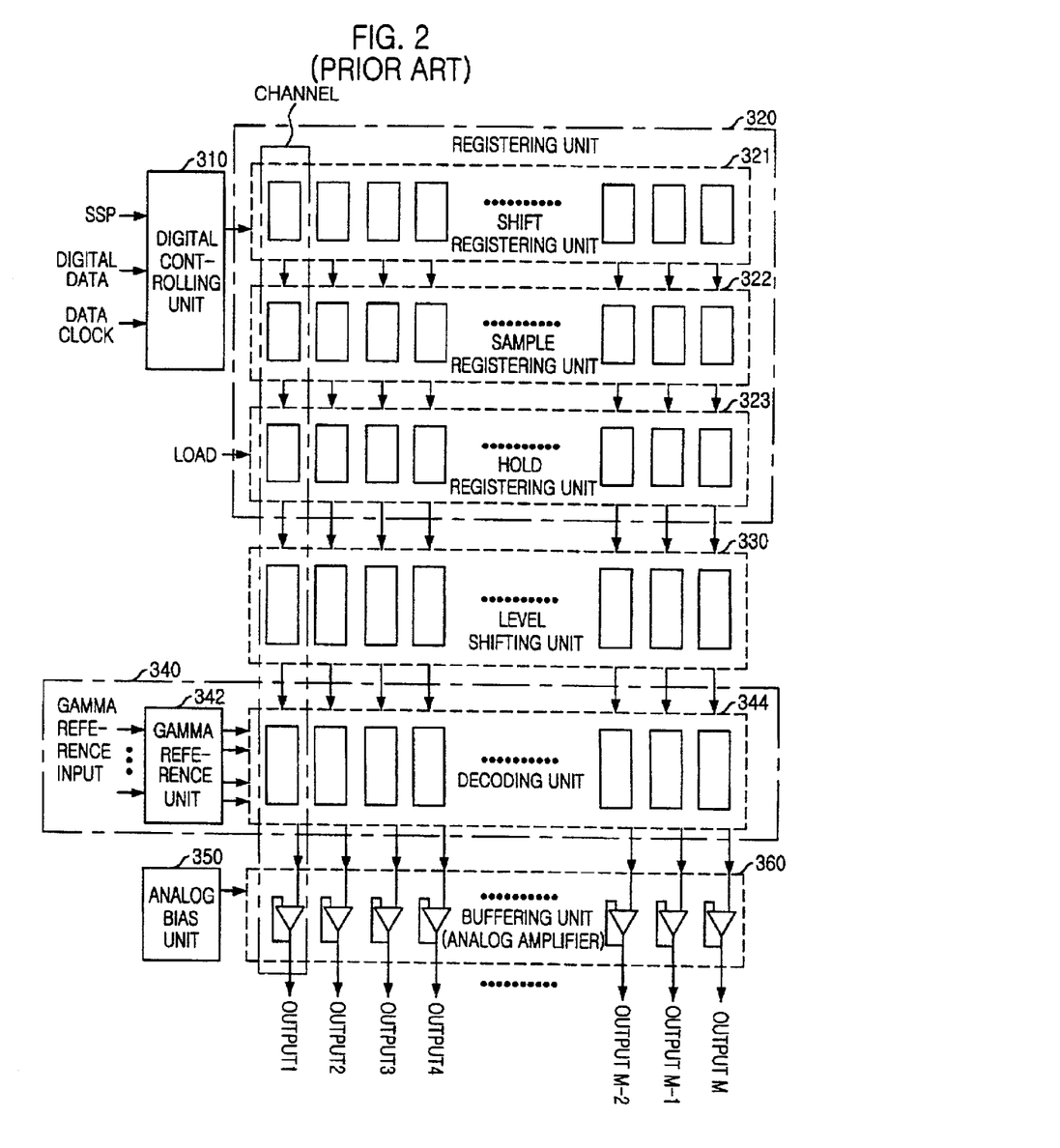
FIG. 2 is a diagram illustrating a conventional source driver in the TFT-LCD.

FIG. 2 is a diagram illustrating a source driver in the TFT-LCD. The source driver includes a digital controlling unit 310, a registering unit 320, a level-shifting unit 330, a digital/analog converting unit 340, an analog bias unit 350 and a buffering unit 360. The registering unit 320 is generally driven at a low voltage level, such as 3.3V, and the digital/analog converting unit 340 and the buffering unit 360 are generally driven at a high voltage level, such as 6–12V.

The digital controlling unit 310 controls the registering unit 320. The digital controlling unit 310 receives source start pulses (SSP), data clocks and digital data from the timing control unit 100 in FIG. 1 and transmits the digital data to the registering unit 320.

The registering unit 320 stores digital data from the digital controlling unit 310. The registering unit 320 includes a shift registering unit 321, a sample registering unit 322 and a hold registering unit 323. All of the digital data is routed through the shift registering unit 321 and stored in the sample registering unit 322. The digital data stored in the sample registering unit 322 is transmitted through the hold registering unit 323 to the level-shifting unit 330 via control signals (LOAD) provided by the timing control unit 100. The level-shifting unit 330 shifts the levels of the digital signals from the registering unit 320 and provides the level-shifted digital signals to the digital/analog converting unit 340.

The digital/analog converting unit 340 converts the level-shifted digital signals into analog signals. The digital/analog converting unit 340 includes a gamma reference unit 342 and a decoding unit 344. The decoding unit 344 outputs an analog signal, which is one of the analog signals of the gamma reference unit 342, in response to a select signal. The select signal is a digital signal passed through the level shifting unit 330. The buffering unit 360 buffers the outputs of the digital/analog converting unit 340 by the bias provided by the analog bias unit 350 and provides the buffered outputs to the source lines of the LCD panel 100.

Figure 3:
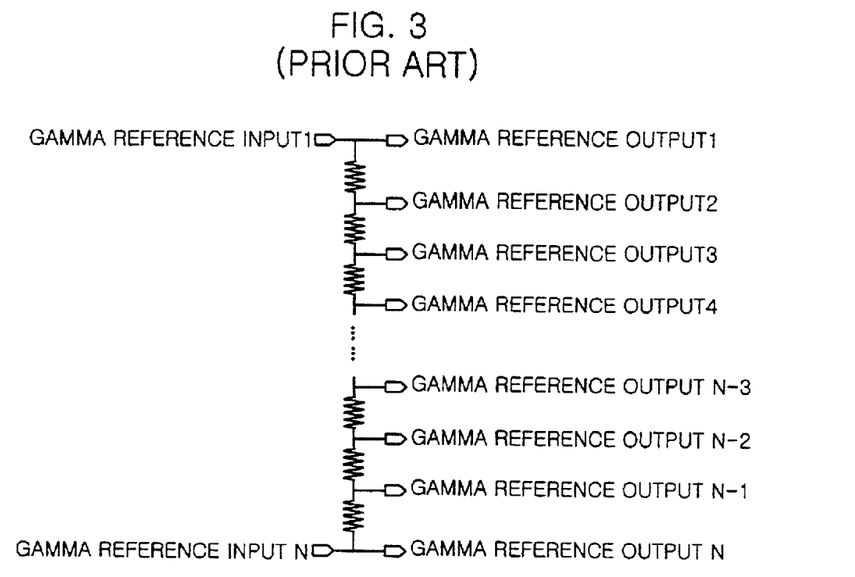
FIG. 3 is a circuit diagram illustrating a conventional gamma reference unit of a source driver.

FIG. 3 is a circuit diagram illustrating the gamma reference unit 342. The gamma reference unit 342 generates a plurality of gamma reference outputs as analog signals having different levels. The gamma reference unit 342 includes a voltage divider that generates a voltage according to the digital signals outputted from the level shifting unit 330. The voltage divider includes a plurality of resister arrays. A gamma reference output is then transmitted to the buffering unit 360.

Figure 4:
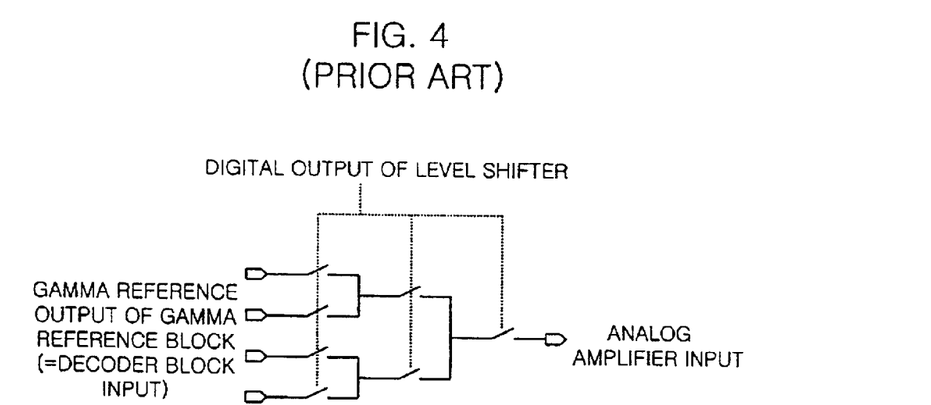
FIG. 4 is a diagram illustrating one channel of a conventional decoding unit.
Figure 5:
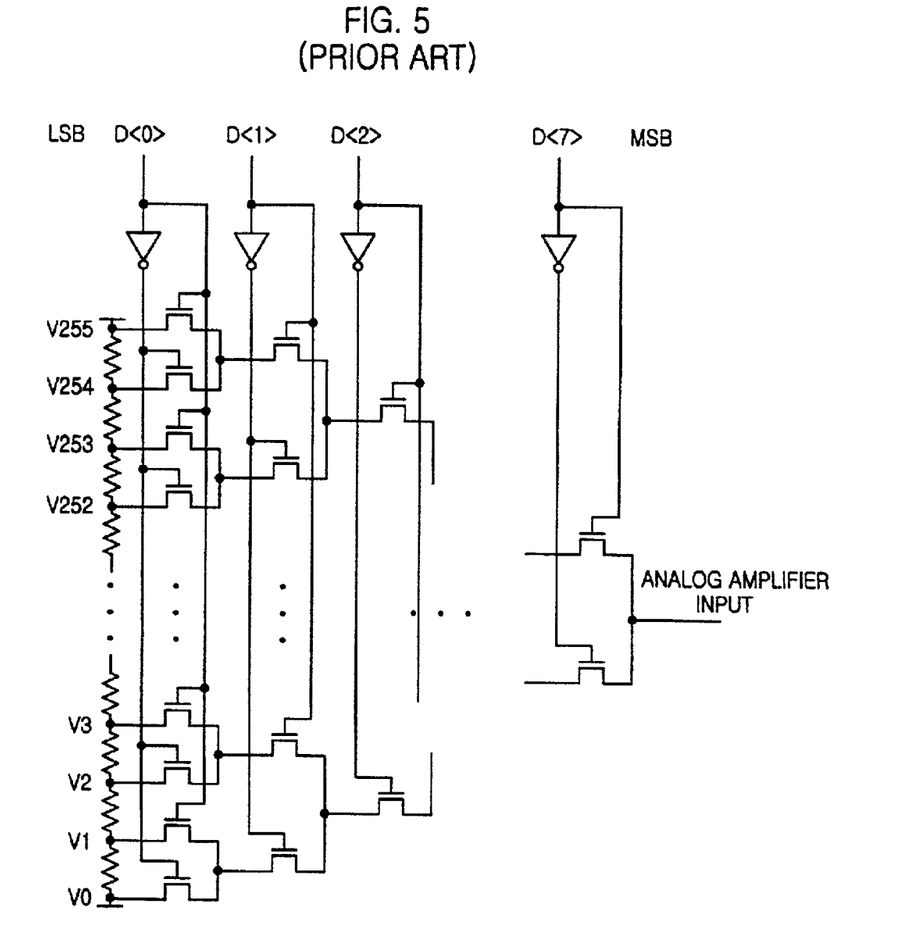
FIG. 5 is a circuit diagram illustrating one channel of a conventional decoding unit.

FIG. 4 is a diagram illustrating one channel of the decoding unit 344. FIG. 5 is a circuit diagram illustrating one channel of the decoding unit 344. The decoding unit 344 includes eight serially coupled switch units. The output of the gamma reference unit 342 generally has to pass through the eight serially coupled MOS transistors in order to be transmitted to the buffering unit 360.

With this configuration, 510 MOS transistors are needed. Because the gamma reference output signals have to pass through the eight switches, the operational speed of the TFT-LCD driver is decreased and the signals become weak. In other words, it takes a long time to drive the signals resulting in decreased operational speed of the driver due to the increased resistance from the number of interconnections. The increased resistance aggravates a phase margin of an operational amplifier and causes a resistance-capacitance (RC) delay so that additional time is required to drive the signals. Accordingly, a configuration capable of reducing the number of switch units is desirable.

Figure 6:
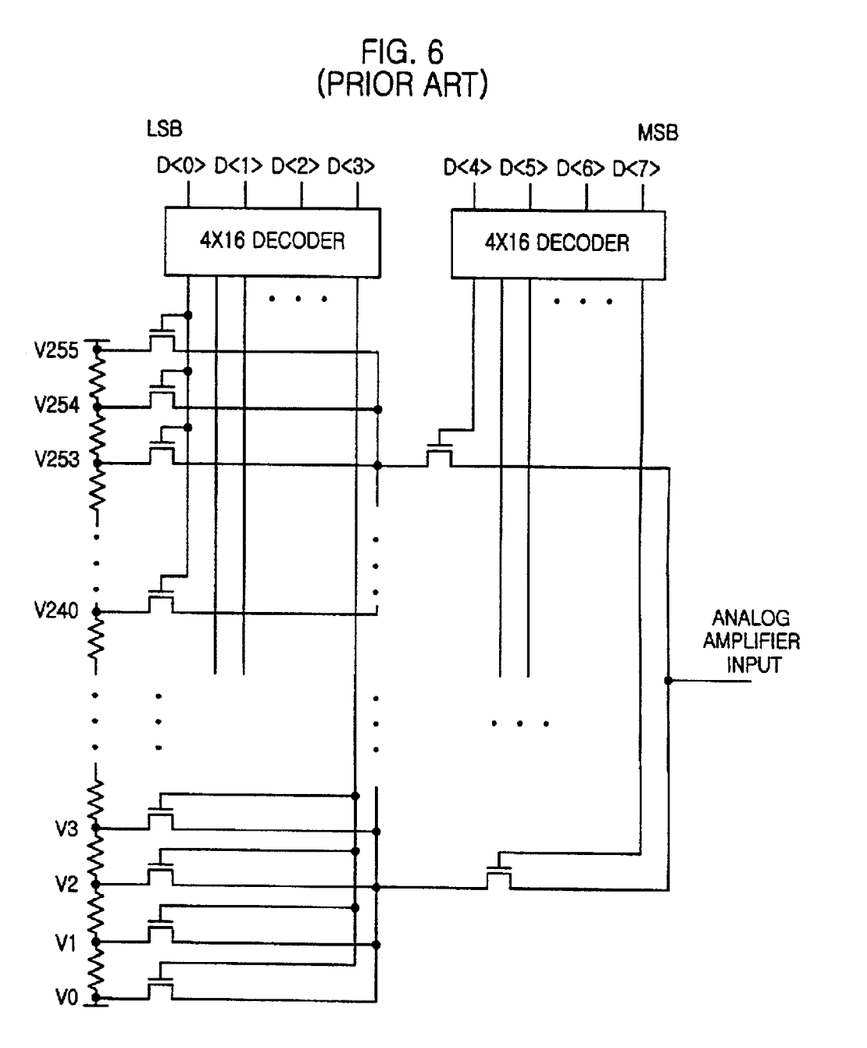
FIG. 6 is a circuit diagram illustrating a conventional decoding unit using a 4×16 decoder.

FIG. 6 is a circuit diagram illustrating one channel of an existing decoding unit 344 using an improved 4×16 decoder. The 4×16 decoder may be used to solve the above-stated problems. The voltage generated by the voltage divider having the resistor arrays in the gamma reference unit 342 is outputted and passed through just two switch units.

Figure 7:
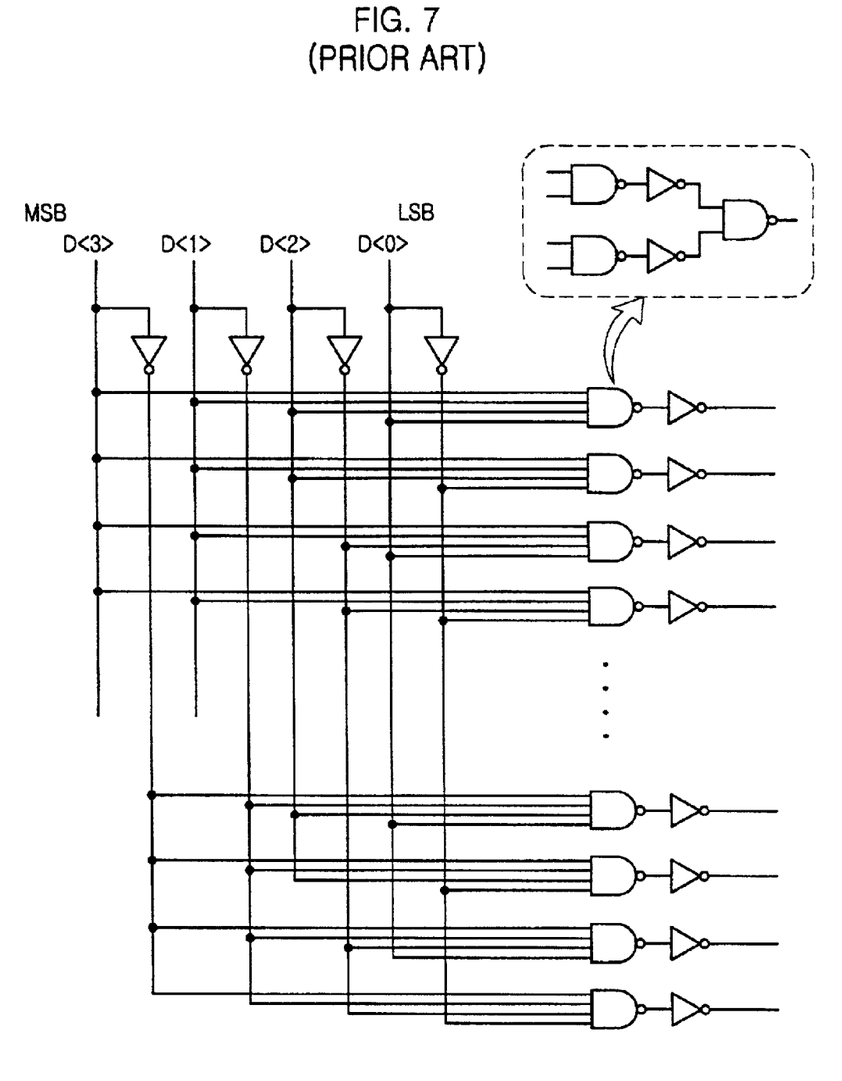
FIG. 7 is a circuit diagram illustrating the 4×16 decoder of FIG. 6.

FIG. 7 is a circuit diagram illustrating the 4×16 decoder of FIG. 6. The 4×16 decoder includes several NAND gates and several inverters. However, in configuring the resistance digital/analog (RDA) converter using the 4×16 decoder, the size of the integrated circuit is considerably increased because the 4×16 decoder occupies a large area in an integrated circuit. Generally, to implement a 4-input NAND gate, three NAND gates and two inverters are required. Each NAND gate comprises two NMOS transistors and resistor, or alternatively four NMOS transistors. Also, the inverter includes CMOS transistors, for example, one PMOS transistor and one NMOS transistor. Accordingly, the 4×6 decoder is costly due to the number of transistors required to implement the 4×6 decoder.

SUMMARY OF THE INVENTION

In accordance with an aspect of the invention, a decoding apparatus is provided which includes: an input for inputting digital data signals; a switch for selecting an output node from among the plurality of output nodes in response to the digital data signals provided from the input; and a precharge circuit for precharging a plurality of output nodes in response to a precharge signal.

In accordance with another aspect of the invention, a resistance array digital/analog converting apparatus is provided which includes: a decoding circuit having a plurality of output nodes, the decoding circuit including: an input for inputting digital data signals; a precharge circuit for precharging the plurality of output units with a first logic value in response to a precharge signal before the plurality of output nodes are enabled by a digital data signal provided from the input; and a first switch for selecting an output node from among the plurality of output nodes in response to the digital signals provided from the input. The resistance array digital/analog converting apparatus further includes: a gamma reference signal generating circuit for generating analog signals having a plurality of different levels; and a second switch for selecting one signal from the analog signals and outputting the selected signal in accordance with signals outputted from the decoding circuit.

In accordance with yet another aspect of the invention a decoding method is provided which includes: precharging a plurality of output nodes with a first logic value; providing a second logic value to an output node from among the plurality of output nodes according to a first inputted digital data signal; and protecting against an over-current path that is formed when the digital data signal is applied.

In accordance with a further aspect of the invention, a method of performing resistance array digital/analog conversion is provided, the method comprising: precharging a plurality of output nodes with a first logic value; providing a second logic value to the plurality of output nodes according to an inputted digital data signal; generating an analog signal having a plurality of different levels; and outputting a signal selected from the analog signals according to the second logic value.

BRIEF DESCRIPTION OF THE DRAWINGS

Exemplary devices and methods will now be described with reference to the accompanying drawings, wherein.

DETAILED DESCRIPTION OF THE EXAMPLES

Figure 8:
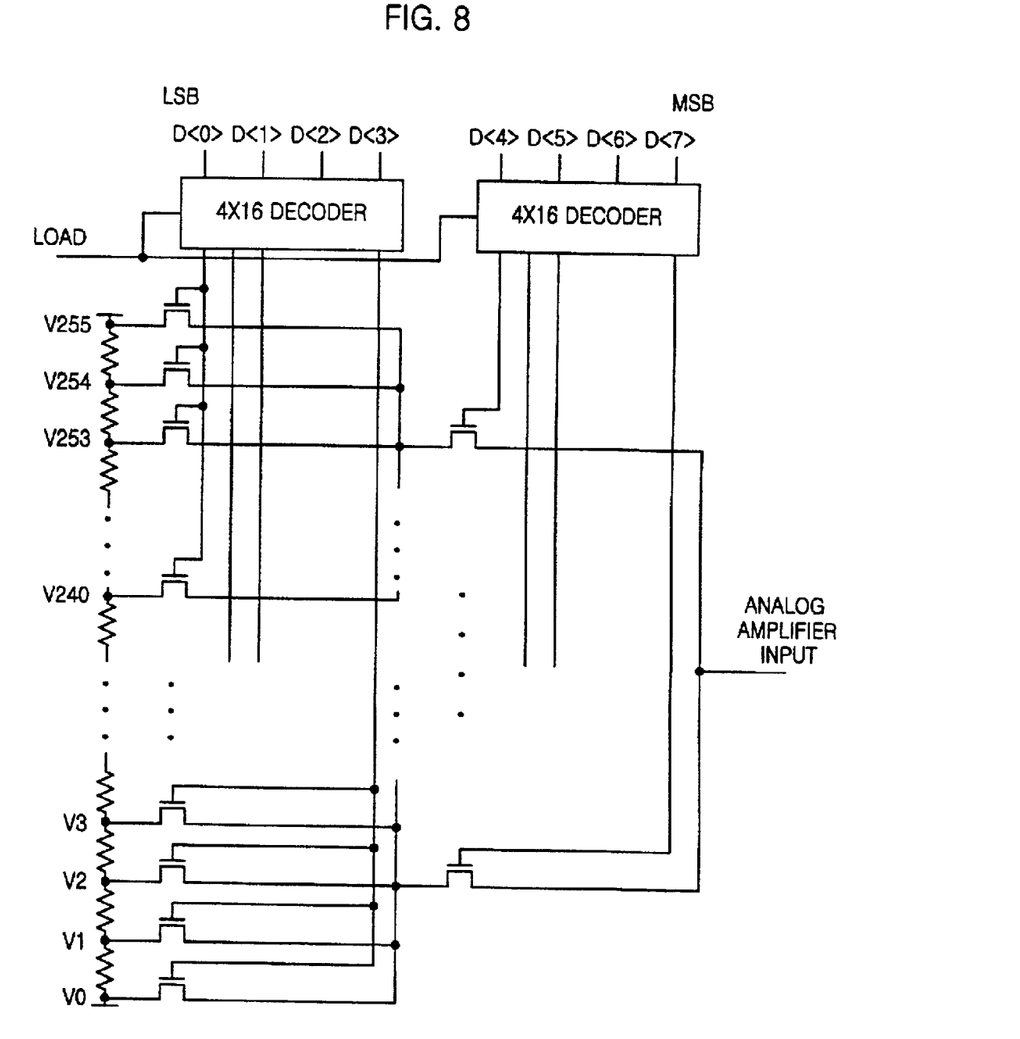
FIG. 8 is a circuit diagram illustrating an example of a 4×16 decoder corresponding to one channel of a decoding unit.

An exemplary decoding apparatus and an exemplary resistance digital/analog converting apparatus constructed in accordance with the teachings of the disclosure is shown in FIG. 8, which illustrates one channel of a decoding unit using a 4×16 decoder. A control signal (represented as 'LOAD') controls the 4×16 decoder and drives a TFT-LCD.

When data is latched in every channel of a driver IC, the control signal (LOAD) becomes 'high' for one clock cycle and then returns to 'low'.

Figure 9A:
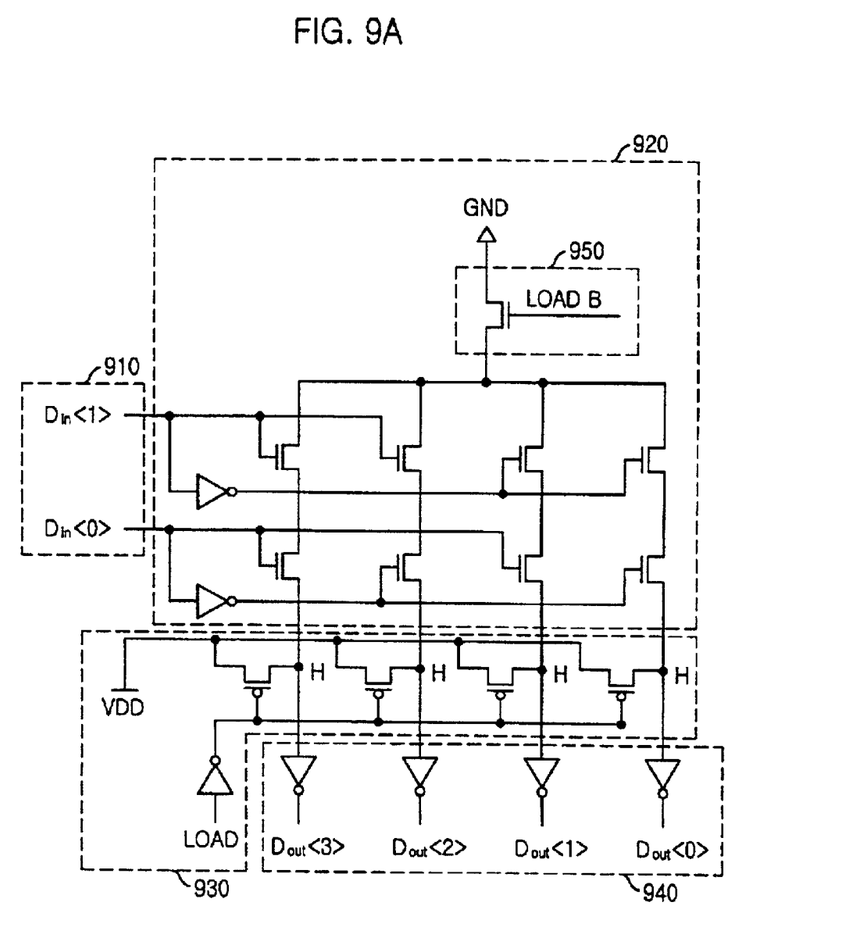
FIG. 9A is a detailed circuit diagram illustrating an example of a 2×4 decoder in one channel of a decoding unit.

FIG. 9A is a detailed circuit diagram illustrating a 2×4 decoder implemented in one channel of the decoding unit. For the sake of convenience, the 2×4 decoder is described instead of the 4×16 decoder. However, as will be understood by those of ordinary skill in the art, the implementation of a 2×4 decoder as described herein may just as easily be applied to a 4×16 decoder, or any other decoder configuration. The 2×4 decoder includes a digital signal input unit 910, a precharge unit 930 and a switch unit 920.

Figure 9B:
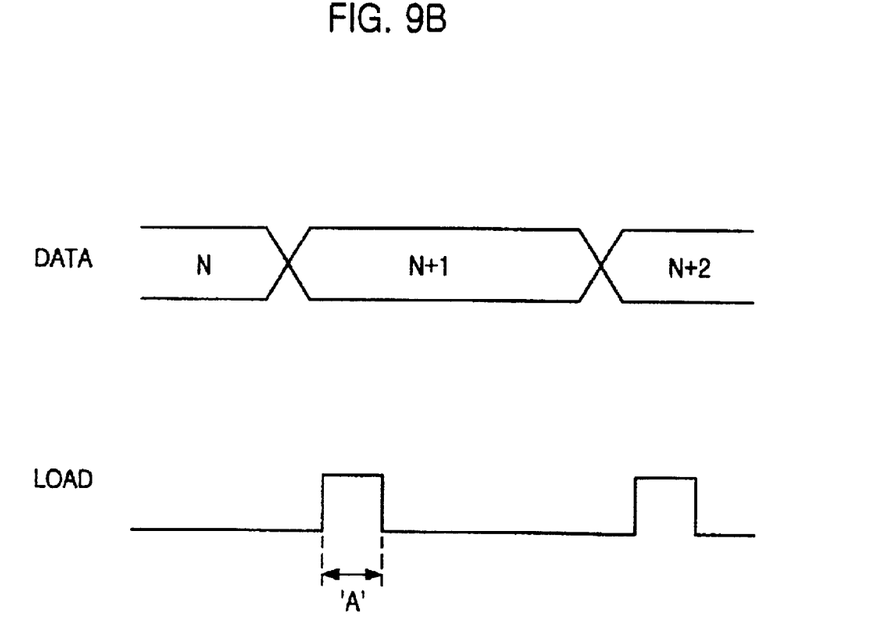
FIG. 9B is a timing diagram illustrating an operation of the decoder of FIG. 9A.

FIG. 9B is a timing diagram showing an operation of the LOAD signal in FIG. 9A. When data signals are inputted into the switch unit 920, the LOAD signal becomes logic value 'high' only for one clock cycle, represented as 'A' in FIG. 9B and then returns to logic value 'low'.

Referring again to FIG. 9A, the precharge unit 930 precharges a plurality of output nodes, represented as 'H' in FIG. 9A, in response to the first state of the LOAD signal, which is logic value 'high'. The plurality of output nodes are enabled by digital data signals provided from the digital signal input unit 910. After the output nodes are precharged with a drain voltage (VDD), the LOAD signal returns to the logic value 'low'. One of the output nodes is selected in response to the digital data signal provided by the digital signal input unit 910 so that a new data signal is outputted.

The switch unit 920 includes an over-current protecting unit 950 having an NMOS transistor responsive to the inverse of the LOAD signal (LOAD B). In the precharging phase, the digital input signals are also applied to the digital signal input unit 910. If the over-current protecting unit 950 is excluded, an over-current path is formed from VDD to GND with low resistance in the precharging phase and the over-current flows from VDD to GND. This current places stress in the transistors and increases power consumption. The use of the over-current protecting unit 950 helps prevent those problems.

The 2×4 decoder further includes a signal output unit 940 for buffering signals at the output nodes and for outputting the signals into an external circuit of the decoder (not shown). The switch unit 920 includes switches for selecting one output node from among the plurality of output nodes in response to the digital data signals $D_{in}$ and their inversed signals.

The drain voltage (VDD) in the precharge unit 930 is coupled to a drain of each PMOS transistor. The outputs $D_{out}$ of the signal output unit 940 are respectively coupled to a source of each PMOS transistor in the precharge unit 930. If a control signal (LOAD) of logic 'high' is applied to the precharge unit 930, a signal of logic 'low' is applied to a gate of each PMOS transistor in the precharge unit 930 so that the PMOS transistors are turned 'on' and the drain voltage (VDD) is applied to the signal output nodes. Accordingly, the signal output nodes are precharged so that a signal of logic 'low' is applied to each output $D_{out}$ of the signal output unit 940.

For example, when the digital signals $D_{in}<1>=1$ and $D_{in}<0>=0$ are applied from the digital signal input unit 910 to the switch unit 920, the output nodes are precharged with drain voltage (VDD) in response to the LOAD signal, which is logic 'high'. Consequently, the output $D_{out}$ becomes logic 'low'. At this time, a short path is formed from the drain voltage (VDD) to the ground (GND) because one of the switch lines is turned 'on' in response to the digital signals so that the over-current flows. However, since the NMOS transistor of the over-current protecting unit 950 turns 'off' in response to the LOAD B signal, there is protection against the over-current flow.

After the output nodes are precharged, the LOAD signal is transitioned to logic 'low' and the over-current protecting unit 950 is turned 'on'. One switch line in the switch unit 920 is selected and only one output line $D_{out}<2>$ becomes logic 'high'. After a logic 'high' signal is outputted at the $D_{out}<2>$ line, the LOAD signal is applied to the precharge unit 930 so that the output nodes are reset to be precharged.

In one example of one channel of the decoding unit, if a 2×4 decoder is used, four decoders are required. Those of ordinary skill in the art will recognize that the teachings of the invention may be applied to a variety of combinations and arrangements of decoders. Accordingly, any decoder configuration in accordance with the teachings of this disclosure may be applied to a decoding unit, which includes the decoding unit 344 described in FIG. 6. For instance, in accordance with another example of one channel of the decoding unit, if a 4×16 decoder is used two decoders are required as described in FIG. 6.

Figure 10:
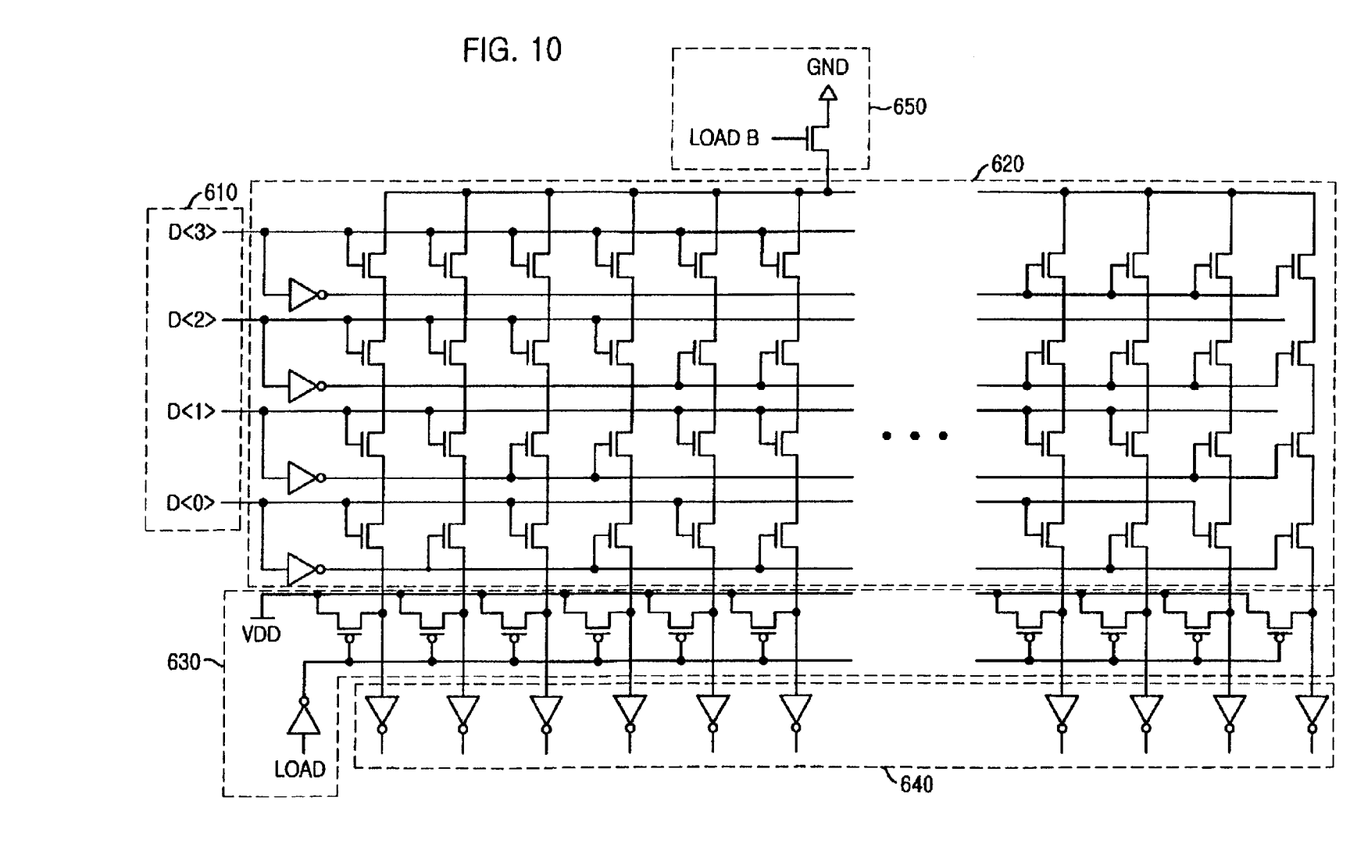
FIG. 10 is a detailed circuit diagram illustrating a disclosed 4×16 decoder in one channel of a decoding unit.

FIG. 10 is a detailed circuit diagram illustrating an example of a 4×16 decoder in one channel of a decoding unit. When compared with the 2×4 decoder, it can be seen that the number of input and output nodes and switches are merely increased. The operation of the 4×16 decoder is the same as that of the 2×4 decoder. However, when the 4×16 decoder is applied to one channel of the decoding unit, the number of switch units, which are passed through by the data signals from the resistance array of the gamma reference unit to the output unit, can be reduced to just two. The number of switches (NMOS transistors) 272 is enough for the 4×16 decoder to perform.

In yet another example of one channel of the decoding unit, a single 8×256 decoder can also be used. The 8×256 decoder can be applied to one channel of the decoding unit and the number of switch units is reduced to one.

Accordingly, the size of the decoder apparatus is minimized by using a precharging scheme in a resistance array digital/analog converting apparatus implemented in an IC for driving a TFT-LCD. The number of switch units is also optimized so that the driving speed of IC in the TFT-LCD is improved.

From the forgoing, persons of ordinary skill in the art will appreciate that a decoding apparatus has been provided. The disclosed decoding apparatus is capable of being employed in a resistance-array converting apparatus.

While the device has been described with respect to particular examples, it will be apparent to those of ordinary skill in the art that the scope of this patent is not limited thereto. On the contrary, this patent covers all devices and methods falling within the scope and spirit of the accompanying claims.

What is claimed is:

1. A decoding apparatus, comprising:
   an input for inputting digital data signals;
   a switch for selecting an output node from among a plurality of output nodes in response to the digital data signals provided from the input;
   a precharge circuit to precharge the plurality of output nodes in response to a precharge signal; and
   a signal output circuit for buffering decoded signals of the plurality of output nodes and for outputting the buffered decoded signals.

2. The decoding apparatus as recited in claim 1, wherein the switch comprises:
   an over-current protecting circuit for protection from an over-current path that is formed when the digital data signals are applied from the input to the switch; and
   a first plurality of MOS transistors forming a plurality of switch lines.

3. The decoding apparatus as recited in claim 2, wherein the precharge circuit comprises a second plurality of MOS transistors and the over-current protection circuit comprises a MOS transistor, wherein the second plurality of MOS transistors in the precharge circuit comprise an opposite type of transistor than the MOS transistor in the over-current protection circuit.

4. The decoding apparatus as recited in claim 3, wherein the second plurality of MOS transistors is turned on when a first logic value of the precharge signal are applied thereto so that the plurality of output nodes of the switch are precharged to a drain voltage level.

5. The decoding apparatus as recited in claim 4, wherein the switch further comprises a plurality of inverters to invert the digital signals.

6. The decoding apparatus as recited in claim 2, wherein the digital data signal provided from the input in a 2-bit digital data signal.

7. The decoding apparatus as recited in claim 2, wherein the digital data signal provided from the input in a 4-bit digital data signal.

8. The decoding apparatus as recited in claim 2, wherein the digital data signal provided from the input in an 8-bit digital data signal.

9. A resistance array digital/analog converting apparatus, comprising:
   a decoding circuit having a plurality of output nodes, wherein the decoding circuit comprises:
      an input for inputting digital data signals;
      a precharge circuit to precharge the plurality of output nodes in response to a precharge signal before the plurality of output nodes are enabled by a digital data signal provided from the input;
      a first switch for selecting an output node from among the plurality of output nodes in response to the digital signals provided from the input; and
      a signal output circuit for buffering decoded signals of the plurality of output nodes and for outputting the buffered decoded signals from the decoding circuit;
   a gamma reference signal generating circuit for generating analog signals having a plurality of different levels; and
   a second switch for selecting one signal from the analog signals and outputting the selected signal in accordance with signals outputted from the signal output circuit.

10. The apparatus as recited in claim 9, wherein the first switch includes:
    an over-current protecting circuit for protection from an over-current path that is formed when the digital data signal is applied from the input; and
    a first plurality of MOS transistors forming a plurality of switch lines.

11. The apparatus as recited in claim 10, wherein the precharge circuit comprises a second plurality of MOS transistors and the over-current protection circuit comprises a MOS transistor, wherein the second plurality of MOS transistors in the precharge circuit have an opposite type against the MOS transistor in the over-current protection circuit.

12. The apparatus as recited in claim 10, wherein the decoding circuit comprises four 2×4 decoding units and the second switch comprises four switch units.

13. The apparatus as recited in claim 10, wherein the decoding circuit comprises four 4×16 decoding units and the second switch comprises two switch units.

14. The apparatus as recited in claim 10, wherein the decoding circuit comprises four 8×256 decoding units and the second switch comprises one switch unit.

15. The apparatus as recited in claim 10, wherein the second plurality of MOS transistors are turned on when a first logic value of the precharge signal is applied so that the plurality of output nodes of the switch are precharged.

16. The apparatus as recited in claim 15, wherein the first switch further comprises a plurality of inverters to invert the digital signals.

17. A decoding method, comprising:
   precharging a plurality of output nodes with a first logic value;
   providing a second logic value to an output node from among the plurality of output nodes according to a first inputted digital data signal;
   buffering decoded signals of the plurality of the output nodes and outputting the buffered decoded signals; and
   protecting against an over-current path that is formed when the digital data signal is applied.

18. The decoding method as recited in claim 17, wherein the decoding method further comprises resetting the plurality of output nodes for decoding a second inputted digital data signal.

19. The decoding method as recited in claim 18, wherein the digital inputted signal is two bits.

20. The decoding method as recited in claim 18, wherein the digital inputted signal is four bits.

21. The decoding method as recited in claim 18, wherein the digital inputted signal is eight bits.

22. A method for performing resistance array digital/analog conversion, comprising:
   precharging a plurality of output nodes with a first logic value;
   providing a second logic value to the plurality of output nodes according to an inputted digital data signal;
   buffering decoded signals of the plurality of output nodes;
   outputting the buffered decoded signals;
   generating an analog signal having a plurality of different levels; and
   outputting a signal selected from the analog signals according to the second logic value of the buffered decoded signal.

* * * * *